United States Patent [19]

Bain

[11] Patent Number: 5,651,015
[45] Date of Patent: Jul. 22, 1997

[54] APPARATUS AND METHOD FOR SYNCHRONIZATION AND ERROR DETECTION OF RECEIVED DIGITAL DATA BURSTS IN A TDM/TDMA SYSTEM

[75] Inventor: Peter Douglas Bain, Ottawa, Canada

[73] Assignee: Northern Telecom Limited, Montreal, Canada

[21] Appl. No.: 695,994

[22] Filed: Aug. 15, 1996

Related U.S. Application Data

[63] Continuation of Ser. No. 398,626, Mar. 2, 1995, abandoned.

[51] Int. Cl.$^6$ .............................. H04L 7/00; H03M 13/00
[52] U.S. Cl. .................................. 371/42; 371/47.1
[58] Field of Search ............................ 371/42, 43, 46, 371/47.1

[56] References Cited

U.S. PATENT DOCUMENTS 5,084,891  1/1992  Ariyavisitakul et al. .............. 371/42

OTHER PUBLICATIONS

Li–Fung Change & Nelson R. Sollenberger, Performance of a TDMA Portable Radio System Using a Block Code for Burst Synchronization and Error Detection, GLOBECOM '89: IEEE Global Telecommunications Conference, pp. 1371–1376 1989.

V. K. Varma, N. R. Sollenberger, L. F. Chang & H. W. Arnold, A Flexible Low–Delay TDMA Frame Structure, Communications, 1991 IEEE International Conference, pp. 1474–1479 1991.

N. R. Sollenberger, Justin C. I. Chuang, Li Fung Chang, & Sirikiat Ariyavisitakul, Architecture and Implementation of an Efficient and Robust TDMA FRame Structure for Digitable Portable Communications, IEEE Transactions on Behicular Technology, vol. 40, N Feb. 1991.

Li Fung Change, N. R. Sollenberger, & Sirikiat Ariyavisitakul, Performance of a TDMA Portable Radio System Using A Cyclic Block Code for Burst Synchronization and Error Detection, IEEE Transactions on Communications, vol. 41, No. 1, pp. 22–31 Feb. 1993.

*Primary Examiner*—Paul P. Gordon
*Assistant Examiner*—Steven R. Garland
*Attorney, Agent, or Firm*—John A. Granchelli

[57] ABSTRACT

A method and apparatus for bit synchronization and error detection uses bit rotation of a received data burst and division by a polynomial generator to produce a syndrome. Syndrome corrector logic steps and circuitry determine the bit slippage and correct the syndrome for the slippage to produce an error syndrome. If there are no errors, the bit slippage value is used to synchronize the received data burst.

17 Claims, 6 Drawing Sheets a) $\pi_0 \ldots \pi_{p-2}\pi_{p-1} | \chi_0\, \chi_1\, \chi_2\, \chi_3 \ldots \chi_{n-3}\, \chi_{n-2}\, \chi_{n-1} | \sigma_0\, \sigma_1\, \sigma_2 \ldots \sigma_{p-1}$ b) $p_{-2} \ldots p_{p-4}\, p_{p-3} | p_{p-2}\, p_{p-1}\, \sim c_0\, c_1 \ldots c_{n-5}\, c_{n-4}\, c_{n-3} | c_{n-2}\, \sim c_{n-1}\, s_0 \ldots s_{p-3}$ c) $p_1 \ldots p_{p-1}\, \sim c_0 | c_1\, c_2\, c_3\, c_4 \ldots c_{n-2}\, \sim c_{n-1}\, s_0 | s_1\, s_2\, s_3 \ldots s_p$

APPARATUS AND METHOD FOR SYNCHRONIZATION AND ERROR DETECTION OF RECEIVED DIGITAL DATA BURSTS IN A TDM/TDMA SYSTEM

This is a continuation of patent application Ser. No. 08/398,626, filed on Mar. 2, 1995, now abandoned, by P. D. Bain for "SYNCHRONIZATION AND ERROR DETECTION IN A TDM/TDMA SYSTEM".

The invention relates to performing bit synchronization and error detection of received digital data bursts in a time division multiplexed/time division multiple access (TDM/TDMA) system.

BACKGROUND OF THE INVENTION

It is well known in the art to perform combined synchronization and error detection/error correction, for example as described in the "Background of the Disclosure" of U.S. Pat. No. 5,084,891, by Ariyavisitakul et al., issued Jun. 28, 1992, to Bell Communications Research, Inc. Ariyavisitakul et al. teach a technique for jointly performing bit synchronization and error detection on a TDMA burst of received digital data. The technique of Ariyavistakul et al. relies on successive addition and deletion of marker bits from a received word coupled with successive polynomial division in a two-pass approach using a common generator polynomial to successively determine timing and error syndrome values for this word.

Specifically, a cyclically redundant codeword that contains a pre-defined number of information bits, followed by a pre-defined number of parity bits, e.g. a (161,147) codeword, is formed for transmission, using e.g. either a TDM packet or TDMA burst for carriage over an error-prone radio link. The parity bits are determined by dividing the information bits by a given binary generator polynomial, g(x). The first and last bits in the codeword are then marked through bit inversion thereof to yield a first set of marker bits.

The resulting codeword is then transmitted to a receiving site. At the receiving site, a two-pass approach is undertaken to recover synchronization of a corresponding received word and to determine whether any bit errors exist therein. Specifically, within the synchronization pass, a second set of marker bits is first inserted into the received word, again through inverting the first and last bits therein. The resulting marked word can then be rotated to the left by a predetermined number, such as seven, of bit positions to place potentially erroneous bits at the end of this word. A multi-bit timing syndrome value is then determined for the resulting, now rotated, marked word, by dividing this word by the polynomial generator g(x). The timing syndrome value is then used, for example, to access a look-up table to yield a corresponding value of bit slippage. The received word is then shifted, i.e. advanced or retarded, by an amount of bit positions and in a direction specified by the bit slippage value to yield an intermediate word. If excessive bit slippage has occurred in the received word, this slippage can not be corrected. As such, a suitable error signal is provided to instruct a receiver burst processor to ignore this word. At this point, an error detection pass is undertaken on the intermediate word. Within this pass, the first set of marker bits is first removed from the intermediate word to form an unmarked word for which an error syndrome value is then determined through polynomial division of this latter word by the polynomial generator g(x). In the event the error syndrome value is zero, then the unmarked word is provided as a synchronized substantially error-free codeword to a suitable output point, such as a memory location or output lead. Alternatively, if the unmarked word contains one or more bit errors as indicated by a non-zero valued error syndrome, an error signal is also provided to a receiver burst processor to instruct it to ignore this word.

Due to the serial nature of the synchronization and error detection, several delays occur between reception of the data and delivery of the data following synchronization and error detection.

SUMMARY OF THE INVENTION

An object of the present invention is to provide improved bit synchronization and error detection of received digital data bursts in a time division multiplexed/time division multiple access (TDM/TDMA) system.

In accordance with one aspect of the present invention there is provided a method of bit synchronization and error detection of received digital data bursts in a time division multiplexed time division multiple access system, the method comprising the steps of: receiving a digital data burst; rotating the digital data burst a predetermined number of bits; dividing the rotated digital data burst by a predetermined polynomial to generate a syndrome; determining bit positions in the syndrome having a predetermined bit value; in dependence upon relative position of the bit positions having the predetermined bit value, determining direction and magnitude of bit synchronization slippage; and in dependence upon the direction and magnitude of bit synchronization slippage, applying a correction to the syndrome in order to recover an error syndrome therefrom.

In accordance with another aspect of the present invention there is provided apparatus for bit synchronization and error detection of received digital data bursts in a time division multiplexed/time division multiple access system, the apparatus comprising: an input for receiving digital data bursts; a data burst store connected to the input; a bit rotation store connected to the input; a polynomial divider connected to the input and an output of the bit rotation store; a syndrome corrector having a first store connected to an output of the polynomial divider, second and third stores connected to the input and having outputs for indicating bit slippage, data validity and for providing a corrected syndrome.

BRIEF DESCRIPTION OF THE DRAWINGS

The invention will be further understood from the following detailed description with reference to the drawings in which:

Referring to FIG. 1, there is illustrated in a block diagram, a known synchronization and error detection circuit. The circuit includes an input 10 for received data, and outputs 12 and 14 for recovered data and error status, respectively. The input 10 is connected to a one-burst store 16 and a 7-bit rotate block 18. The one-burst store 16 is connected to a selectable delay block 20. The 7-bit rotate block 18 is connected to a divide by g(x) block 22. The divide by g(x) block 22 is connected to a synchronization logic block 24. The synchronization logic block 24 is connected to the selectable delay block 20. The selectable delay block 20 is connected to a second one-burst store 26 and a second divide by g(x) block 28. The second one-burst store 26 is connected to the data output 12. The second divide by g(x) block 18 is connected to the error status output 14.

Figure 1:
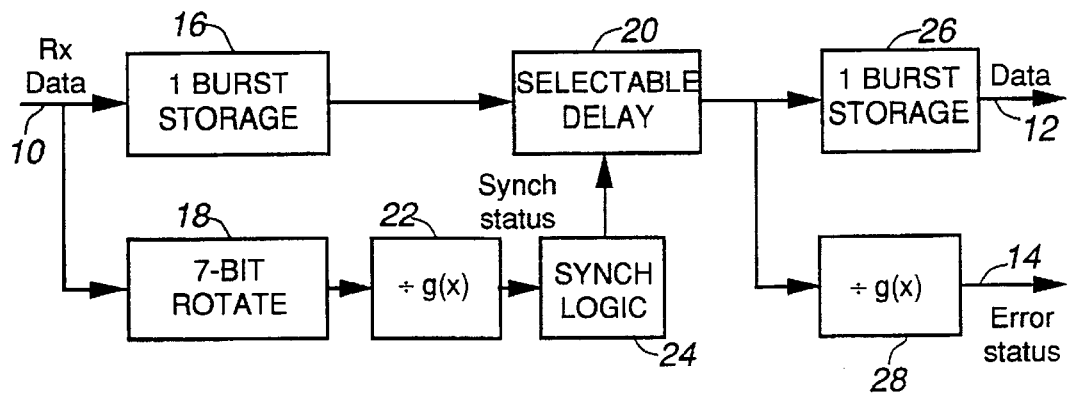
FIG. 1 illustrates in a block diagram a known synchronization error detection circuit.

In operation, an incoming bit stream appearing on input 10 is routed to synchronization circuitry, including the one-burst store 16 and the selectable delay block 20, which attempts to recover correct synchronization therefrom. The selectable delay block 20 provides delay which is sufficient to store an incoming 161-bit TDMA bit stream with all possible synchronization positions while its timing syndrome is being determined. The timing syndrome is determined through the 7-bit rotate block 18 which inverts the first and 161st bit in the incoming bit stream, i.e. the received word, to insert a second set of marker bits at these two bit positions and to provide a 7-bit rotation. The purpose of this 7-bit rotation is to place the first seven bits of the now marked received word at the least significant bit positions therein. These bits are likely to contain errors if a timing offset occurred. The serial output from 7-bit rotate block 18 is applied in serial fashion to the divide by g(x) block 22. As the data is shifted into the divider during successive clock pulses, the divider divides the 161-bit word by the following generator polynomial:

$$g(x)=x^{14}+x^{11}+x^4+x^3+x^2+1 \qquad (1)$$

to yield a fourteen bit timing syndrome value in parallel form to the synchronization logic block 24. For each predefined timing syndrome value that is associated with a different burst timing offset (synch estimation) value between ±6 bits inclusive, the synchronization logic block 24 outputs a synchronization estimation value to the selectable delay block 20. The output of the selectable delay block 20 is routed to the second one-burst delay store 26. This delay saves the unmarked word while error detection is being performed by the second divide by g(x) block 28 that is identical to the divide by g(x) block 22. If any of the error syndrome bits is non-zero, indicating the presence of an error a "1" bit is output via the error status output 14.

Figure 2A:
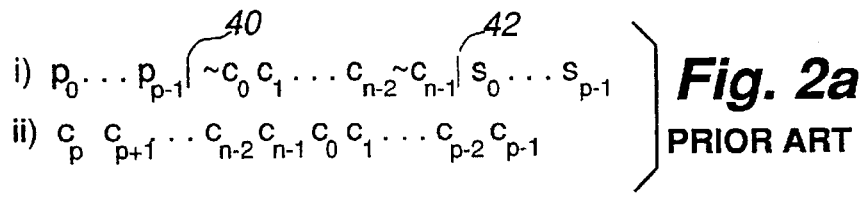
FIGS. 2a, 2b, and 2c illustrate processing of a burst of digital data by the circuit of FIG. 1.

The known transmitter encodes the transmitted burst in two steps: it first appends a 2p-bit checksum (in this case, p=7) which makes the burst divisible by the generator polynomial g(x). It then inverts the first and last bits of the burst, making the burst an invalid codeword, and transmits it. The value of p, in other words, is equal to half of the number of bits in the checksum. The one-burst store 16 stores the p bits before what it supposes is the beginning of the burst (the prefix $P_0$ to $P_{p-1}$), the codeword $c_0$ to $c_{n-1}$ and the p bits after the supposed end of the burst (the suffix $s_0$ to $s_{p-1}$). Referring to FIG. 2a, this is shown in 'i' with vertical bars 40 and 42 to indicate where the receiver supposes the start of the codeword (burst) to be. The 7-bit rotate block 18 then inverts $c_0$ and $c_{n-1}$, removes the prefix and suffix, and rotates the codeword p bits to the left, e.g. p=7, as shown in 'ii' of FIG. 2a. The inversion (shown here by a '~') cancels the transmitter's inversion. Since this is a cyclic code, any codeword divisible by g(x) is also divisible by g(x) after a rotation (also known as a cyclic shift). If there are no errors, this rotated codeword will give a zero syndrome.

Figure 2B:
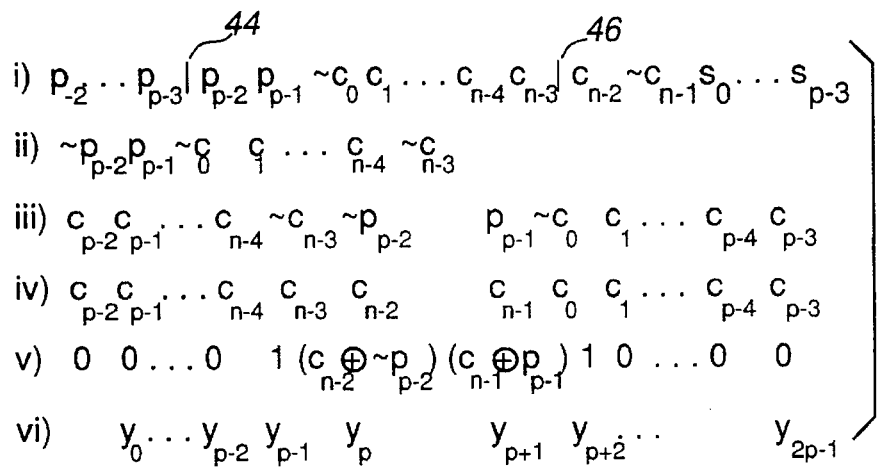
Figure 2C:
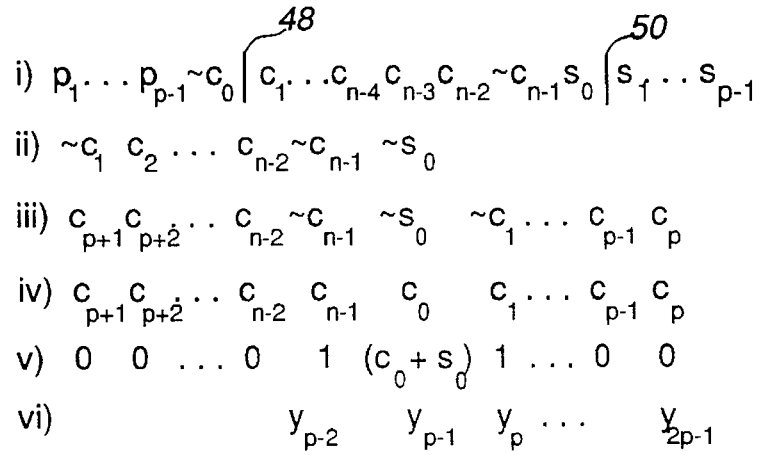

If the transmitter and receiver are offset, the receiver will treat prefix bits as part of the codeword, as indicated in FIG. 2b by vertical bars 44 and 46, and discard the last bits of the transmitted codeword (positive offset) or will drop the first bits of the codeword, as indicated in FIG. 2c by vertical bars 48 and 50, and accept suffix bits as the codeword (negative offset). The case of an offset of +2 is shown in 'i' of FIG. 2b. After prefix and suffix removal and inversion of first and last bits, the codeword is as shown in 'ii' of FIG. 2b. After rotation, the codeword is as shown in 'iii' FIG. 2b. This is not a legal codeword, but resembles the rotated legal codeword shown in 'iv' of FIG. 2b with an error polynomial e shown in 'v' of FIG. 2b. The numbering of the syndrome bits is shown in 'vi' of FIG. 2b.

The degree of the error polynomial e is p+1, and thus the syndrome s after division will equal e. Also, the p-3 low-order bits and the p-1 high order bits of the 2p bit syndrome are zero. With respect to the syndrome of FIG. 2b'vi', the p-3 low-order bits correspond to bits $Y_{p+3}$ to $Y_{2p-1}$ and the p-1 high-order bits correspond to bit $Y_0$ $Y_{p-2}$.

Similarly, FIG. 2c illustrates in 'i' through 'vi' an offset of −1. Here the degree of the error polynomial e is p+2, and thus the syndrome s after division will equal e. Also, the p-1 low-order bits and p-2 high order bits are zero. With respect to the syndrome of FIG. 2c'vi', the p-1 low-order bits correspond to bits $Y_{p+1}$ to $Y_{2p-1}$ and the p-2 high-order bits correspond to bit $Y_0$ to $Y_{p-3}$.

If the syndrome is non-zero, the receiver checks the number $n_t$ of trailing zeros (i.e., low-order bits which are zero) and the number $n_1$ of leading zeros (i.e., high-order bits which are zero) in the syndrome to determine the offset. If $n_1$=p−1, then the offset ω is positive and its magnitude is p−1−$n_t$. If $n_t$=p−1, then the ω is negative and its magnitude is p−1−$n_1$. If the syndrome is non-zero and neither $n_t$ nor $n_1$ equals p−1, then the burst is bad.

Figures 3, 4:
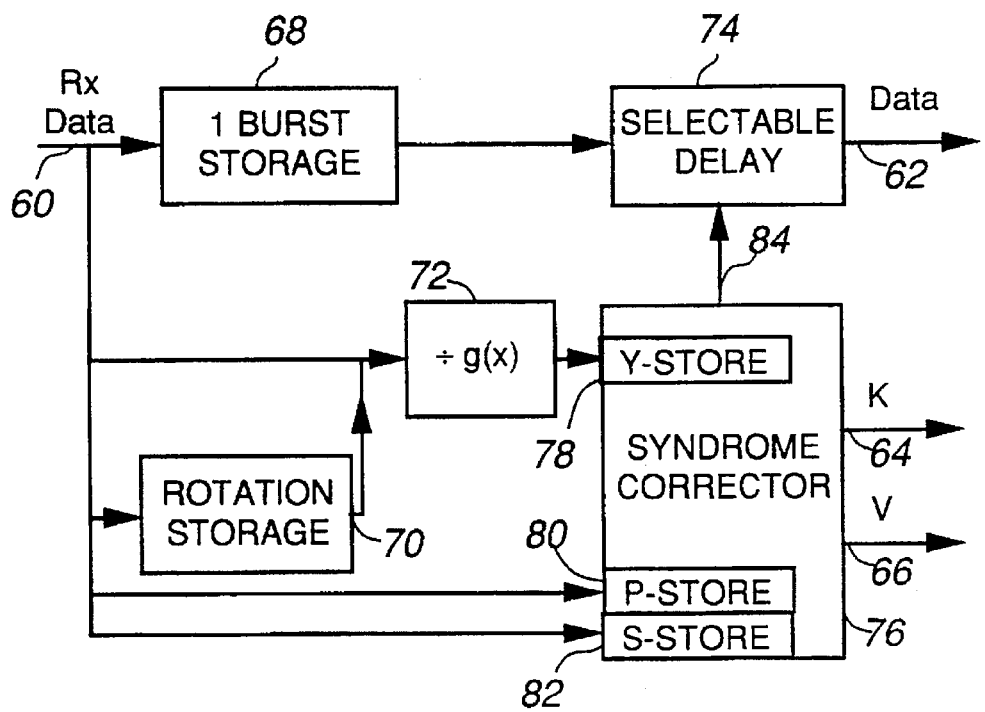
FIG. 3 illustrates in a block diagram an error detection and synchronization circuit in accordance with an embodiment of the present invention.
FIG. 4 illustrates correspondence between assumed received data, data of FIG. 2b and FIG. 2c, respectively.

Referring to FIG. 3, there is illustrated in a block diagram, an error detection and synchronization circuit in accordance with an embodiment of the present invention. The error detection and synchronization circuit includes an input for received data 60, outputs for data 62, and error indicators K 64 and V 66. The received data input 60 is connected to a 1-burst storage 68, a p-bit rotation storage 70 and a divide by g(x) block 72. Output from the 1-burst storage 68 is connected to a selectable delay 74. A syndrome corrector 76 includes a y-store 78, a p-store 80, and an s-store 82. The y-store 78 is connected to the output of the divide by g(x) block 72. The p-store 80 and S-store 82 are connected to the received data input 60. The syndrome detector 76 has an output 84 connected to the selectable delay 74. Further detail of the syndrome corrector 76 is provided hereinbelow with reference to FIGS. 7 and 8.

From the operation of the prior art circuit in FIG. 1, it can be seen that in the case of an offset, but otherwise correct codeword, the reason for a non-zero syndrome is due to three effects: inversion of the wrong bits, exclusion of the codeword bits, and inclusion of prefix or suffix bits. Given the syndrome, the amount of the offset ω and the prefix and suffix bits, the present invention applies a correction to the syndrome to remove the three aforementioned effects.

In operation, correction of the data burst involves the following: assume a syndrome $y=y_0 \ldots y_{2p-1}$ where $y_0$ is the high-order (leftmost) bit, and assume the received data consist of:

$$\pi_0 \ldots \pi_{p-1} | \chi 0 \; \chi 1 \ldots \chi n-2 \; \chi n-1 | \sigma_0 \ldots \sigma_{p-1}$$

where $\pi, \chi,$ and $\sigma$ are the supposed prefix, codeword, and suffix. (The receiver assumes $\chi_0$ and $\chi_{n-1}$ are the bits of the supposed codeword.) The receiver assumes $\chi_0$ and $\chi_{n-1}$ are versions of C2 and $C_{n-1}$. In FIG. 4,$a$) shows the correspondence of $\pi\chi\sigma$ to a codeword in proper synchronization, similar to FIG. 2$a$ $i$), and $b$) and $c$) of FIG. 4 show the correspondence of $\pi\chi\sigma$ with the example data from FIG. 2$b$ $i$) and FIG. 2$c$ $i$), respectively.

Figure 5A:
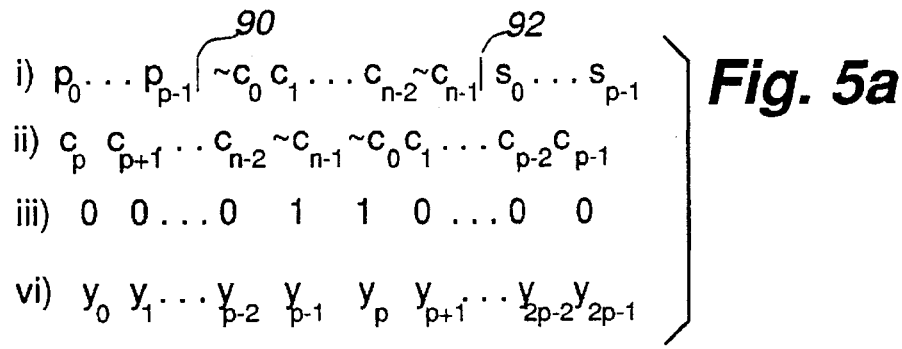
FIGS. 5a, 5b, and 5c illustrate processing of a burst of digital data by the circuit of FIG. 3.
Figure 5B:
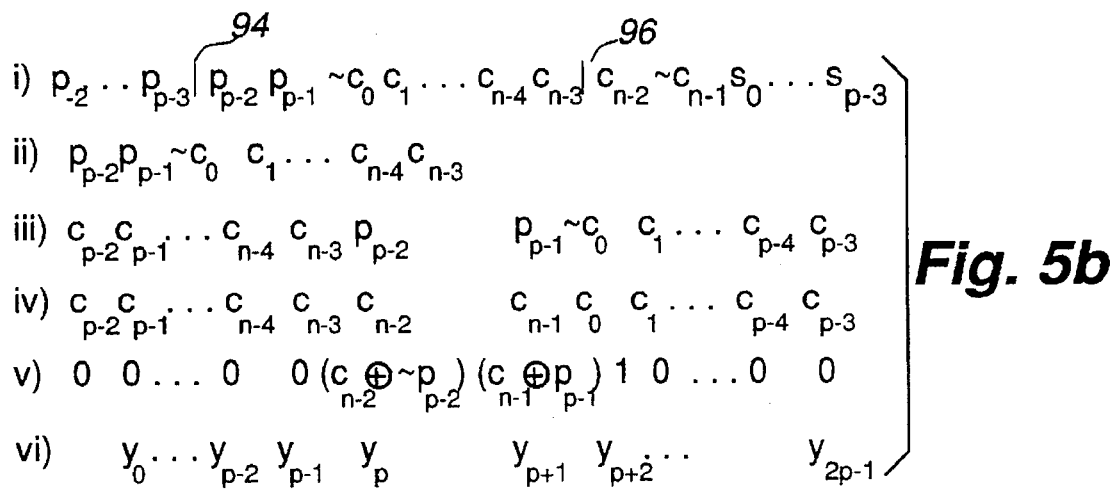
Figure 5C:
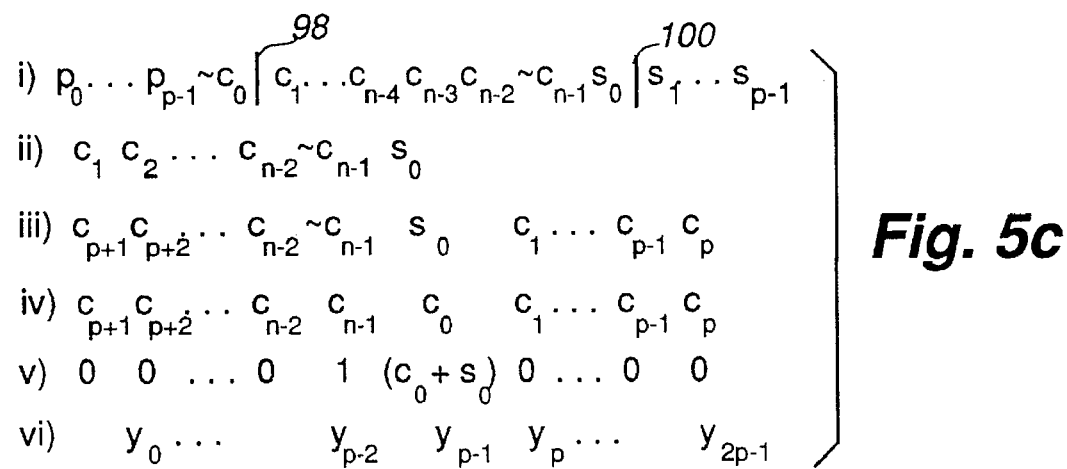

The same data as illustrated in FIGS. 2$a$ $i$), 2$b$ $i$) and 2$c$ $i$) are used in FIGS. 5$a$ $i$), 5$b$ $i$), and 5$c$ $i$), respectively, with regard to the embodiment of the present invention. In the present embodiment, the receiver does not invert any bits before computing the syndrome. The received codeword contains two known errors as bits $c_O$ and $c_{n-1}$ are inverted. Referring to FIG. 5$a$, the example of the received data a) of FIG. 4 having no slip is shown as FIG. 5$a$, $i$). The beginning and end of the presumed codeword is indicated by bars 90 and 92, respectively. The presumed prefix and suffix are stripped off and the data is rotated p bits with the result as shown in FIG. 5$a$, $ii$). Unlike the prior art solution, there is no inversion of the first and last bits of the presumed codeword, in this case bits $\bar{c}_O$ and $\bar{c}_{n-1}$. Since the degree of the error polynomial is less than the degree of the generator g(x); the degree of the syndrome is the same. The syndrome for a burst with no errors and no synchronization slip will be all-zeroes except for ones in positions $y_p$ and $y_{p-1}$ of the syndrome bits illustrated in FIG. 5$a$ $vi$), corresponding to the rotated positions of bits $c_O$ and $c_{n-1}$, as illustrated in FIG. 5$a$, $iii$).

If the transmitter and receiver are out of synchronization (slipped), the receiver either treats prefix bits as part of the codeword and discards the last bits of the transmitted codeword (positive slip) or drops the first bits of the codeword and accepts suffix bits as the codeword (negative slip). The case of a slip $\omega=+2$ is illustrated in FIG. 5$b$. The slipped data is shown in FIG. 5$b$, $i$) with the beginning and end of the presumed codeword indicated by bars 94 and 96, respectively. After prefix and suffix removal, the codeword is as shown in FIG. 5$b$, $ii$). After rotation, the codeword is as shown in FIG. 5$b$, $iii$). This resembles a real rotated codeword illustrated in FIG. 5$b$, $iv$), thus the error polynomial illustrated in 'v)' of FIG. 5$b$ can be seen as a result of exclusive ORing of the received code and in 'iii)' with the real codeword in 'iv)'. The numbering of the syndrome bits is illustrated in 'vi)' of FIG. 5$b$.

Similarly, referring to FIG. 5$c$, the example of the received data c) of FIG. 4 is illustrated. The case of a slip of $\omega=-1$ is shown in FIG. 5$c$, $i$), with the beginning and end of the presumed codeword indicated by bars 98 and 100, respectively. The received codeword after stripping prefix and suffix is as shown in FIG. 5$c$, $ii$). After rotation, the received codeword of FIG. 5$c$,$iii$) resembles a real codeword of FIG. 5$c$, $iv$), hence, the error syndrome is given of FIG. 5$c$, $v$). The numbering of the syndrome bits is given in FIG. 5$c$, $vi$).

Figure 6:
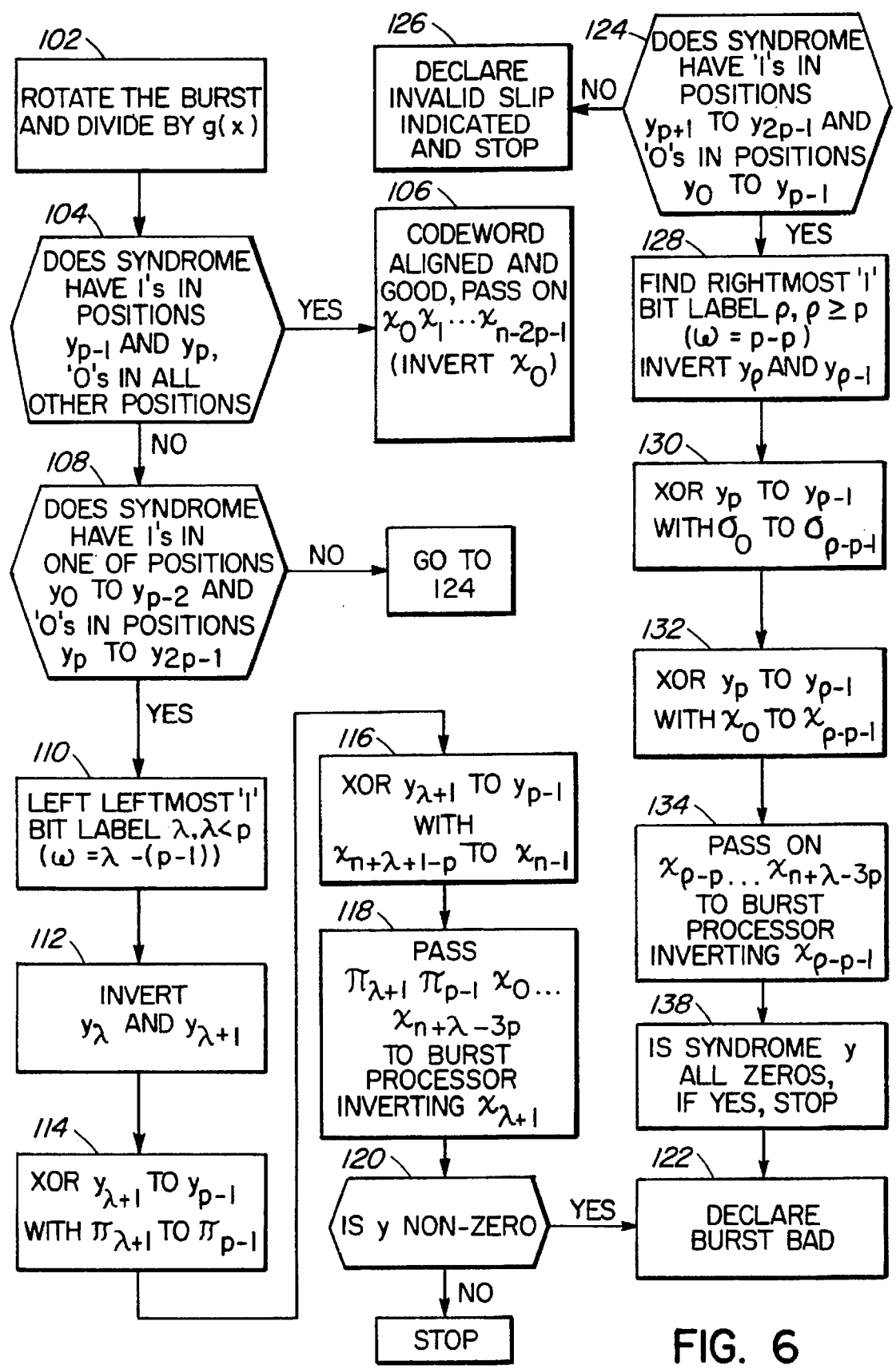
FIG. 6 illustrates in a flow chart the method of synchronization and error detection performed by the circuit of FIG. 3.

The procedure for determining slippage and correcting the syndrome for received data $\pi_O \ldots \pi_{p-2}\pi_{p-1}|\chi^O \; \chi^1 \; \chi^2 \; \chi^3 \ldots \chi n-3 \; \chi n-2 \; \chi n-1|\sigma 0 \; \sigma 1 \; \sigma 2 \ldots \sigma p-1$, is illustrated in FIG. 6.

1) Rotate the burst, and divide by g(x), as represented by box 102.

2) Determine if the syndrome contains '1's in positions $y_{p-1}$ and $y_p$ and zeroes in all other bits as represented by box 104, if yes, deem the codeword aligned and good as represented by box 106. Pass on $\chi_0 \; \chi_1 \ldots \chi_{n-2p-1}$, inverting $\chi_0$, to the burst processor and stop. Bits $\chi n-2p \ldots \chi n-1$ contain the checksum. Otherwise go to paragraph 3.

3) Determine if the syndrome contains one or more '1's in positions $Y_0$ to $Y_{p-2}$ and '0's in positions $Y_p$ to $Y_{2p-1}$, as represented by box 108, if yes the slip is negative, and go to paragraph 4. Otherwise, go to paragraph 8.

4) Find the leftmost '1' bit and label it $\lambda, \lambda < p$. $\omega = \lambda - (p-1)$, as represented by box 110. In other words, $y\lambda=1$ and $yk=0, k<\lambda$. Invert $y_\lambda$ and $y_{\lambda+1}$, as represented by box 112. (This inverts $c_O$ and $c_{n-1}$.)

5) XOR $y\lambda+1$ through $y_{p-1}$ with $\pi_{so\;+1}$ through $\pi_{p-1}$, as represented by box 114. This adds $c_0$ to $c_{-\omega-1}$.

6) XOR $y_{\lambda+1}$ through $y_{p-1}$ with $\chi n+\lambda+1-p$ through $\chi_{n-1}$, as represented by box 116. (This removes $s_0$ to $s_{-\omega-1}$).

7) Pass on $\pi_{\lambda+1} \ldots \pi_{p-1} \; \chi 0 \ldots , \chi n+\lambda-3p$ to the burst processor, inverting $\pi_{\lambda+1}$, (which is really $c_0$), as represented by box 118. Determine if syndrome y is non-zero, as represented by box 120, if yes, declare the burst bad as represented by box 122. If y is zero STOP.

8) Determine if the syndrome contains one or more '1's in positions $Y_{p+1}$ to $Y_{2p-1}$ and '0's in positions $Y_0$ to $Y_{p-1}$, as represented by box 124, if yes, the slip is positive, go to paragraph 9. Otherwise, declare the indicated slip invalid and stop, as represented by box 126.

9) Find the rightmost (highest numbered) '1' bit and label it $\rho, \rho \geq p$. In other words, $y_\rho=1$ and $y_k=0, k>\rho$. $\omega = \rho - p$. Invert $y_\rho$ and $y_{\rho-1}$, as represented by box 128. (This inverts $c_0$ and $c_{n-1}$).

10) XOR $y_p$ through $y_{\rho-1}$ with $\sigma_0$ to $\sigma_{p-\rho-1}$, as represented by box 130. (This adds $c_{n-\omega}$ to $c_{n-1}$).

11) XOR $y_p$ through $y_{\rho-1}$ with $\chi 0$ through $\chi \rho-p-1$, as represented by box 132. (This removes $p_{n-\omega}$ to $p_{n-1}$)

12) Pass on $\chi_{\rho-p} \ldots \chi_{n+\lambda-3p}$, inverting $\chi_{\rho-p-1}$, (which is really $c_0$), to the burst processor as represented by box 134. Determine if y is zero, as represented by box 138, if no, declare the burst bad, as represented by box 122.

Note that to perform the XORing in paragraphs 5, 6, 10, and 11, bits $\pi 0 \ldots \pi_{p-1} \; \chi 0 \ldots \chi_{p-1}$ are XORed bitwise with bits $\chi n-p-1 \ldots \chi n-1\sigma 0 \ldots \sigma_{p-1}$, and XOR the result (selectively) XORed into $y_0 \ldots y_{2p-1}$ respectively.

By way of example, imagine a codeword with an 8-bit checksum (p=4). The syndromes for slips of zero, +2, and −1 are shown in Table A. "X" indicates syndrome bits whose values depend on $\pi, \chi,$ and $\sigma$.

TABLE A

| Syndrome | $Y_0$ | $Y_1$ | $Y_2$ | $Y_3$ | $Y_4$ | $Y_5$ | $Y_6$ | $Y_7$ |
|---|---|---|---|---|---|---|---|---|
| Zero slip | 0 | 0 | 0 | 1 | 1 | 0 | 0 | 0 |
| slip = +2 | 0 | 0 | 0 | 0 | X | X | 1 | 0 |
| slip = −1 | 0 | 0 | 1 | X | 0 | 0 | 0 | 0 |

Figure 7:
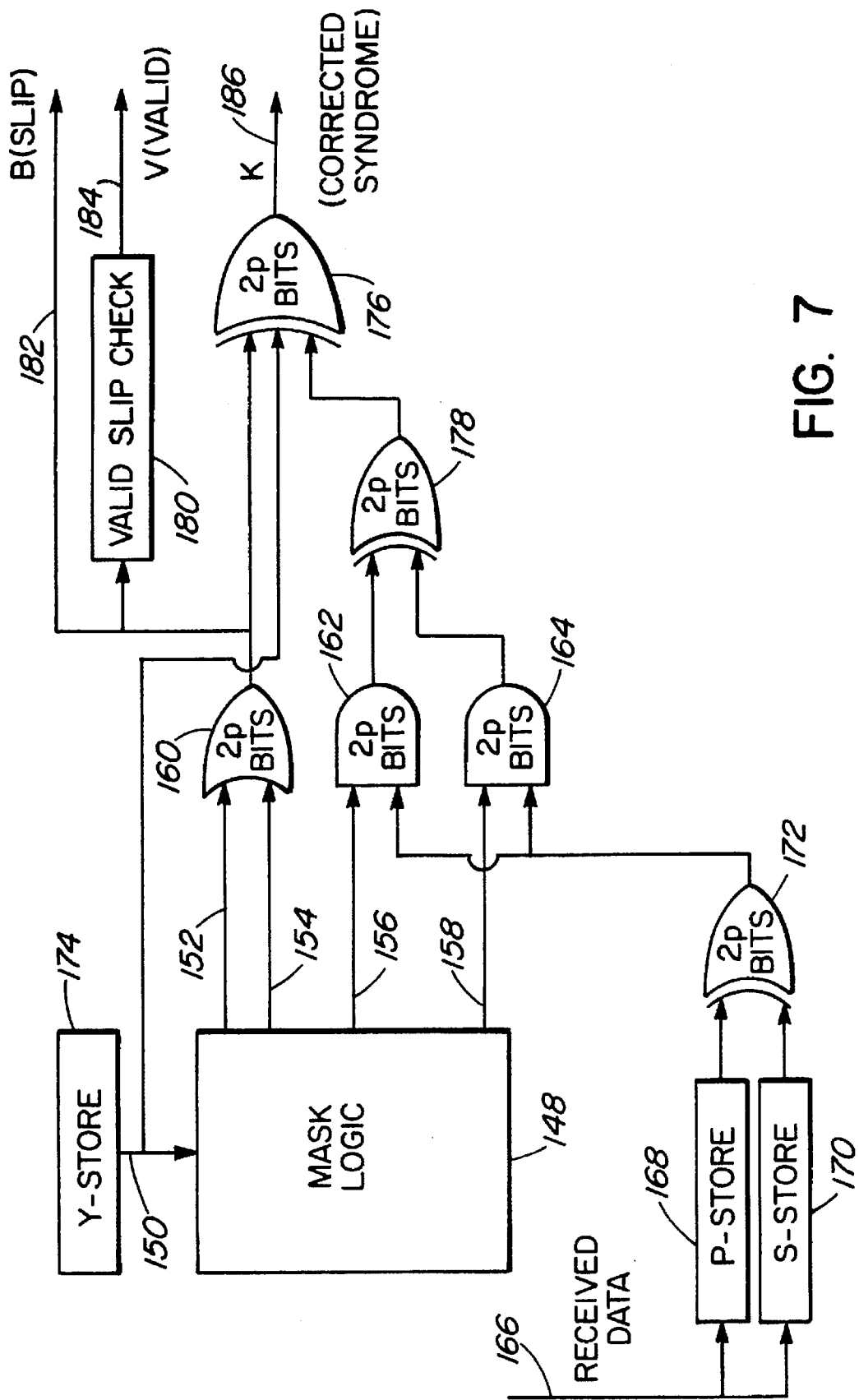
FIG. 7 illustrates in a block diagram a parallel implementation of the error detection and synchronization circuit of FIG. 3.

Referring to FIG. 7 there is schematically illustrated a parallel implementation of the syndrome corrector of FIG. 3. The circuit includes a logic block 148 having an input 150 and four 2p-bit parallel outputs 152, 154, 156, and 158. Outputs 152 and 154 are connected to inputs of an OR gate 160. The output 156 is connected to one input of an AND gate 162. The output 158 is connected to one input of an AND gate 164. An input for received data 166 is connected to a p-store 168 and s-store 170. The 2p-bit parallel outputs of p-store 168 and s-store 170 are input to an XOR gate 172. The XOR gate 172 is connected to the other inputs of AND gates 162 and 164. A syndrome store, y-store 174 is connected to the input 150 and to one input of a three 2p-bit input XOR gate 176. Outputs of AND gates 162 and 164 are input to an XOR gate 178. Outputs of XOR gate 178 and OR gate 160 are connected to the other two inputs of XOR gate 176. The output of OR gate 160 is also applied to a valid slip check block 180 and an output for slip indication 182. A valid indication output 184 is connected to the valid slip check block 180 for providing a signal V. The output of XOR gate 176 is connected to an output 186 for providing a corrected syndrome K.

In operation, the logic block 148 generates four 2p-bit vectors: RI, LI, LX, and RX at outputs 152, 154, 156, and 158, respectively. LI and RI contain zeroes in all positions except $\lambda$ and $\lambda+1$, and $\rho$ and $\rho-1$, respectively. The exceptions are when $\lambda=p-1$ or $\rho=p$, in which case LI or RI contains a one only in position $\lambda$ or $\rho$ respectively. LX contains ones in positions $\lambda+1 \ldots p-1$ and zeroes elsewhere, and RX contains ones in positions $p..\rho-1$ and zeroes elsewhere. If $\lambda \geq p$, LI and LX are all zero, and if $\rho \leq p$, RI and RX are zero. $Y_i = LI_i = RI_i = LX_i = RX_i = 0$, $i<0$ or $i \geq 2p$.

The boolean equation for LI, RI, LX, and RX are:

$$LI_i = (Y_i + Y_{i-1}) \cdot {}^\sim(Y_0 + Y_1 + \ldots Y_{i-2}), \ i<p; \ LI_i=0, \ i \geq p$$

$$RI_i = (Y_i + Y_{i+1}) \cdot {}^\sim(Y_{2p-1} + Y_{2p-2} + \ldots Y_{i+2}), \ i \geq p; \ RI_i=0, \ i<p$$

$$LX_i = LX_{i-1} + LI_{i-1}, \ i<p; \ LX_i=0, \ i \geq p$$

$$RX_i = RX_{i+1} + RI_{i+1}, \ i \geq p; \ RX_i=0, \ i<p$$

Tables B, C, and D give these bit vectors for the zero-slip, +2 slip and −1 slip examples from Table A.

TABLE B

Bit vectors for a zero slip ($\lambda = 3, \rho = 4$)

|  | $Y_0$ | $Y_1$ | $Y_2$ | $Y_3$ | $Y_4$ | $Y_5$ | $Y_6$ | $Y_7$ |
|---|---|---|---|---|---|---|---|---|
| Syndrome | 0 | 0 | 0 | 1 | 1 | 0 | 0 | 0 |
| LI | 0 | 0 | 0 | 1 | 0 | 0 | 0 | 0 |
| RI | 0 | 0 | 0 | 0 | 1 | 0 | 0 | 0 |
| LX | 0 | 0 | 0 | 0 | 0 | 0 | 0 | 0 |
| RX | 0 | 0 | 0 | 0 | 0 | 0 | 0 | 0 |

TABLE C

Bit vectors for slip $\omega = +2$ ($\rho = 6$)

|  | $Y_0$ | $Y_1$ | $Y_2$ | $Y_3$ | $Y_4$ | $Y_5$ | $Y_6$ | $Y_7$ |
|---|---|---|---|---|---|---|---|---|
| Syndrome | 0 | 0 | 0 | 0 | X | X | 1 | 0 |
| LI | 0 | 0 | 0 | 0 | 0 | 0 | 0 | 0 |
| RI | 0 | 0 | 0 | 0 | 0 | 1 | 1 | 0 |
| LX | 0 | 0 | 0 | 0 | 0 | 0 | 0 | 0 |
| RX | 0 | 0 | 0 | 0 | 1 | 1 | 0 | 0 |

TABLE D

Bit vectors for slip $\omega = -1$ ($\lambda = 2$)

|  | $Y_0$ | $Y_1$ | $Y_2$ | $Y_3$ | $Y_4$ | $Y_5$ | $Y_6$ | $Y_7$ |
|---|---|---|---|---|---|---|---|---|
| Syndrome | 0 | 0 | 1 | X | 0 | 0 | 0 | 0 |
| LI | 0 | 0 | 1 | 1 | 0 | 0 | 0 | 0 |
| RI | 0 | 0 | 0 | 0 | 0 | 0 | 0 | 0 |
| LX | 0 | 0 | 0 | 1 | 0 | 0 | 0 | 0 |
| RX | 0 | 0 | 0 | 0 | 0 | 0 | 0 | 0 |

LI and RI invert $y\lambda$, and $y\lambda+1$, and $y\rho$ and $y\rho-1$ respectively, as in steps 4 and 9 described hereinabove. LX and RX select which bits of y to XOR with $\pi$ and $\sigma$, $\pi$ and $\sigma$ are first XORed together, then ANDed with LX and RX, setting them to zero in bit positions not needing correction. The result of this AND is then XORed with the syndrome.

B, a 2p-bit vector indicating the amount of slip, is a bit-wise OR of LI and RI. V, which indicates if the uncorrected syndrome is valid for a slipped codeword, is true if and only if B contains exactly two ones in adjacent positions, i.e. 0 . . . 0 1 1 0 . . . 0. The boolean expression for V is:

$$V = B_0 \cdot B_1 \cdot {}^\sim B_2 \cdot \ldots {}^\sim B_{2p-1} + {}^\sim B_0 \cdot B_1 \cdot B_2 \cdot {}^\sim B_3 \cdot \ldots {}^\sim B_{2p-1} + \ldots + {}^\sim B_0 \cdot {}^\sim B_1 \cdot \ldots B_{2p-1} \cdot B_{2p-1}.$$

The P-store 168 is a 2p-bit shift register to hold the prefix $\pi_0 \ldots \pi_{p-1} \chi_0 \ldots \chi_{p-1}$.

The Y-store 174 is a 2p-bit shift register to hold the computed syndrome y.

The S-store 170 is a 2p-bit shift register to hold the suffix $\chi_{n-p-1} \ldots \chi_{n-1} \sigma_0 \ldots \sigma_{p-1}$.

Figure 8:
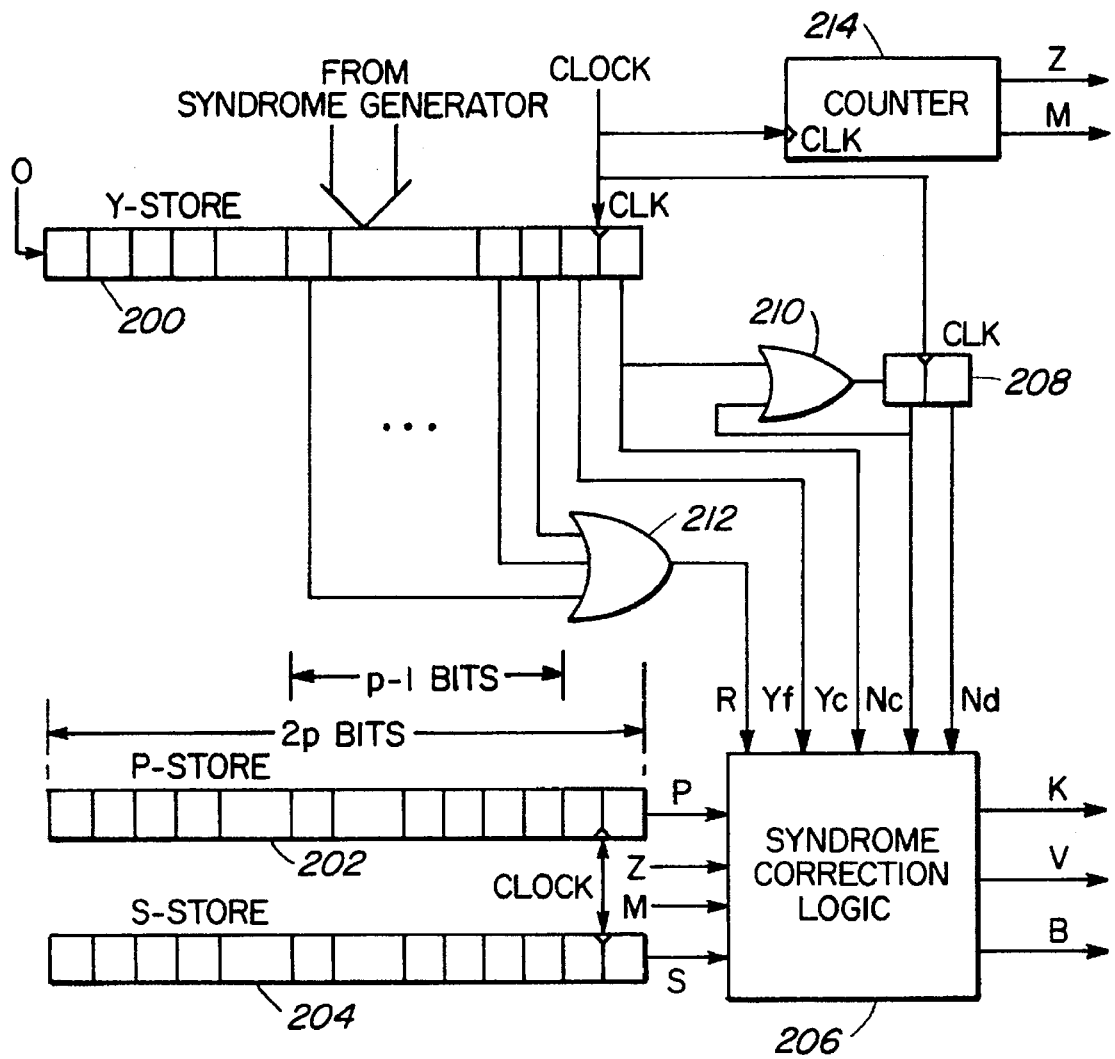
FIG. 8 illustrates in a block diagram a serial implementation of the error detection and synchronization circuit of FIG. 3.

Referring to FIG. 8, there is schematically illustrated a serial implementation of the syndrome corrector of FIG. 3. The circuit includes a Y-store 200, a P-store 202 and an S-store 204.

The P-store 202 is a shift register to hold $\pi_0 \ldots \pi_{p-1} \chi_0 \ldots \chi_{p-1}$.

The Y-store 200 is shift register to hold the computed syndrome y.

The current bit of the syndrome, Yc, is output from the last stage of the Y-store to a syndrome corrector logic block 206.

The next bit of the syndrome, Yf, is output from the second-last stage of the Y-store to the syndrome correction logic block 206.

The S-store 204 is a shift register to hold $\chi n-p-1 \ldots \chi_{n-1} \sigma_0 \ldots \sigma_{p-1}$.

An N-store 208 is a 2-bit shift register containing the OR of all previous values of Yc output from an OR gate 210 whose inputs are Yc and Nc where $N_c$ is the output from the first stage of the N-store 208.

$N_d$ is the output of the second stage of the N-store 208

The syndrome correction logic block 206 provides outputs for:

V, a signal indicating that the syndrome is valid for a shifted codeword;

B, a signal indicating the amount of slip; and

K, the corrected syndrome.

A p−1 bit input OR gate 212 provides an output R, the inclusive-OR of the p−1 bits following Yf, i.e. the third-last to the p+1th-last stages of the Y-store.

A counter 214 with range 0 to 2p−1 provides outputs Z, which is true when the counter contains p−1, and M is true when the value of the counter is less than p. Z and M are input to the syndrome correction logic 206.

The logic also uses the following intermediate boolean results:

$$LI = M \cdot (^-Nc \cdot Yc + Nc \cdot ^-Nd)$$

$$RI = ^-M \cdot ^-R \cdot (Yc + Yf)$$

$$LX = Nc \cdot M$$

$$RX = ^-M \cdot [Yf + R]$$

Since y is scanned from the left, it is possible to generate LI and LX serially by ORing the bits serially into a flip-flop to find the leftmost one (1). To find the rightmost one (1) bit a look ahead of p bits is needed, hence, Yf and R are needed.

The syndrome correction logic is:

$$K = Yc \oplus [LI + RI]$$

$$\oplus [\{LX + RX\} \cdot (S \oplus P)]$$

Tables E, F, and G show the values of the above variables when Yc is $Y_0$ through $Y_7$ for the examples shown in Table A.

TABLE E

Values for a zero slip

| Yc is → | $Y_0$ | $Y_1$ | $Y_2$ | $Y_3$ | $Y_4$ | $Y_5$ | $Y_6$ | $Y_7$ |
|---|---|---|---|---|---|---|---|---|
| Yc | 0 | 0 | 0 | 1 | 1 | 0 | 0 | 0 |
| Yf | 0 | 0 | 1 | 1 | 0 | 0 | 0 | 0 |
| M | 1 | 1 | 1 | 1 | 0 | 0 | 0 | 0 |
| Z | 0 | 0 | 0 | 1 | 0 | 0 | 0 | 0 |
| Nc | 0 | 0 | 0 | 0 | 1 | 1 | 1 | 1 |
| Nd | 0 | 0 | 0 | 0 | 0 | 1 | 1 | 1 |
| R | 1 | 1 | 1 | 0 | 0 | 0 | 0 | 0 |
| LI | 0 | 0 | 0 | 1 | 0 | 0 | 0 | 0 |
| RI | 0 | 0 | 0 | 0 | 1 | 0 | 0 | 0 |
| LX | 0 | 0 | 0 | 0 | 0 | 0 | 0 | 0 |
| RX | 0 | 0 | 0 | 0 | 0 | 0 | 0 | 0 |

TABLE F

Values for slip ω = +2

| Yc is → | $Y_0$ | $Y_1$ | $Y_2$ | $Y_3$ | $Y_4$ | $Y_5$ | $Y_6$ | $Y_7$ |
|---|---|---|---|---|---|---|---|---|
| Yc | 0 | 0 | 0 | 0 | X | X | 1 | 0 |
| Yf | 0 | 0 | 0 | X | X | 1 | 0 | 0 |
| Nc | 0 | 0 | 0 | 0 | 0 | X | X | 1 |
| Nd | 0 | 0 | 0 | 0 | 0 | 0 | X | 1 |
| R | X | X | 1 | 1 | 1 | 0 | 0 | 0 |
| LI | 0 | 0 | 0 | 0 | 0 | 0 | 0 | 0 |
| RI | 0 | 0 | 0 | 0 | 0 | 1 | 1 | 0 |
| LX | 0 | 0 | 0 | 0 | 0 | 0 | 0 | 0 |
| RX | 0 | 0 | 0 | 0 | 1 | 1 | 0 | 0 |

TABLE G

Values for slip ω = −1

| Yc is → | $Y_0$ | $Y_1$ | $Y_2$ | $Y_3$ | $Y_4$ | $Y_5$ | $Y_6$ | $Y_7$ |
|---|---|---|---|---|---|---|---|---|
| Yc | 0 | 0 | 1 | X | 0 | 0 | 0 | 0 |
| Yf | 0 | 1 | X | 0 | 0 | 0 | 0 | 0 |
| Nc | 0 | 0 | 0 | 1 | 1 | 1 | 1 | 1 |
| Nd | 0 | 0 | 0 | 0 | 1 | 1 | 1 | 1 |

TABLE G-continued

Values for slip ω = −1

| Yc is → | $Y_0$ | $Y_1$ | $Y_2$ | $Y_3$ | $Y_4$ | $Y_5$ | $Y_6$ | $Y_7$ |
|---|---|---|---|---|---|---|---|---|
| R | 1 | X | 0 | 0 | 0 | 0 | 0 | 0 |
| LI | 0 | 0 | 1 | 1 | 0 | 0 | 0 | 0 |
| RI | 0 | 0 | 0 | 0 | 0 | 0 | 0 | 0 |
| LX | 0 | 0 | 0 | 1 | 0 | 0 | 0 | 0 |
| RX | 0 | 0 | 0 | 0 | 0 | 0 | 0 | 0 |

To determine whether the indicated slip is valid, the following is calculated:

$$V = Z \cdot (^-Nc \cdot ^-Yc \cdot R + Nc \cdot ^-R + ^-Nc \cdot Yc \cdot Yf \cdot ^-R)$$

The Z term enables the check on the pth bit scanned. The first term inside the parentheses is true if a positive slip has occurred, the second if a negative slip, and the third if no slip has occurred.

The amount of slip is indicated by B, which becomes true after a number of clock cycles proportional to the slip:

$$B = LI + RI$$

The first term is true when the first one before $y_p$ is scanned and the second becomes true one bit before the last one after $y_p$ is scanned.

The serial implementation allows several improvements. The P-store 202 can also be used to rotate the burst going into the syndrome generator 42. The Y-store can be implemented as the syndrome generator's shift register. The alignment and the syndrome correction can be started after only p+1 bits of the syndrome are available. This last improvement reduces the delay to calculate the corrected syndrome and eliminates the need for the S-store, which can then be replaced by a delay line (i.e. shift register) of a few bits.

What is claimed is:

1. A method of bit synchronization and error detection of received digital data bursts in a time division multiplexed time division multiple access system, the method comprising the steps of:

receiving a digital data burst;

rotating the digital data burst a predetermined number of bits;

dividing the rotated digital data burst by a predetermined polynomial to generate a syndrome;

determining bit positions in the syndrome having a predetermined bit value;

in dependence upon relative position of the bit positions having the predetermined bit value, determining direction and magnitude of bit synchronization slippage;

in dependence upon the direction and magnitude of bit synchronization slippage, applying a correction to the syndrome in order to recover an error syndrome therefrom; and determining from the error syndrome whether the received digital data burst is valid and if valid shifting the digital data burst to correct for the direction and magnitude of bit synchronization slippage.

2. A method as claimed in claim 1 wherein the predetermined number of bits is a number p and p is related to a checksum.

3. A method as claimed in claim 2 wherein the syndrome is represented by:

$$Y_0 \ldots Y_{p-2} \, Y_{p-1} \, Y_p \, Y_{p+1} \ldots Y_{2p-2} \, Y_{2p-1}.$$

4. A method as claimed in claim 3 wherein the only bits having the predetermined bit value are $Y_{p-1}$ and $Y_p$, thereby determining the digital data burst to have no bit synchronization slippage and error.

5. A method as claimed in claim 3 wherein the only bits having the predetermined bit value are bits $Y_0$ to $Y_{p-2}$, thereby determining the digital data burst to have a negative slip.

6. A method as claimed in claim 5 wherein the leftmost bit having the predetermined bit value is labelled as $\lambda$, $\lambda < p$ and the step of determining magnitude of bit synchronization slippage, $\omega$, does so in accordance with $\omega = \lambda - (p+1)$.

7. A method as claimed in claim 3 wherein the only bits having the predetermined bit value are bits $Y_{p+1}$ to $Y_{2p-1}$ thereby determining the digital data burst to have a positive slip.

8. A method as claimed in claim 7 wherein the rightmost bit having the predetermined bit value is labelled $\rho$, $\rho \geq p$ and the step of determining magnitude of bit synchronization slippage, $\omega$, does so in accordance with $\omega = \rho - p$.

9. Apparatus for bit synchronization and error detection of received digital data bursts in a time division multiplexed/time division multiple access system, the apparatus comprising:

an input for receiving digital data bursts;

a data burst store connected to the input;

a bit rotation store connected to the input;

a polynomial divider for generating a syndrome connected to the input and an output of the bit rotation store;

a syndrome corrector having a first store connected to an output of the polynomial divider, second and third stores connected to the input and having outputs for indicating bit slippage, data validity and for providing a corrected syndrome.

10. Apparatus as claimed in claim 9 wherein the syndrome corrector comprises a logic circuit for applying a correction to the syndrome.

11. Apparatus as claimed in claim 10 wherein the logic circuit comprises parallel circuitry.

12. Apparatus as claimed in claim 11 wherein the first, second, and third stores include parallel outputs.

13. Apparatus as claimed in claim 12 wherein the parallel circuitry includes a logic block connected to the first store.

14. Apparatus as claimed in claim 13 wherein the logic block includes four 2p bit outputs where p is the number of bits rotation applied by the bit rotation store.

15. Apparatus as claimed in claim 10 wherein the logic circuit comprises serial circuitry.

16. Apparatus as claimed in claim 15 wherein the first, second, and third stores comprise serial shift registers.

17. Apparatus as claimed in claim 16 wherein the serial circuitry includes a logic block connected to the last bit of the first, second, and third serial shift registers.

* * * * *